United States Patent
Behzad

[19]

[11] Patent Number: 6,091,275
[45] Date of Patent: Jul. 18, 2000

[54] LINEAR QUAD VARIABLE GAIN AMPLIFIER AND METHOD FOR IMPLEMENTING SAME

[75] Inventor: Arya R. Behzad, Danville, Calif.

[73] Assignee: Maxim Integrated Products, Inc., Sunnyvale, Calif.

[21] Appl. No.: 09/140,376

[22] Filed: Aug. 26, 1998

Related U.S. Application Data

[60] Provisional application No. 60/087,765, Jun. 2, 1998.

[51] Int. Cl.[7] .............................. H03G 3/30; H03F 3/45
[52] U.S. Cl. ........................ 327/362; 327/563; 330/254
[58] Field of Search .................... 330/254, 252; 327/306, 350, 359, 362, 563

[56] References Cited

U.S. PATENT DOCUMENTS

| | | | |
|---|---|---|---|
| 4,928,074 | 5/1990 | Sato et al. | 330/254 |
| 4,963,836 | 10/1990 | Noguchi et al. | 330/254 |
| 5,030,923 | 7/1991 | Arai | 330/254 |
| 5,418,494 | 5/1995 | Betti et al. | 330/254 |
| 5,677,646 | 10/1997 | Entrikin | 330/252 |
| 5,682,119 | 10/1997 | Soda | 330/254 |
| 5,841,320 | 11/1998 | Ichihara | 330/133 |
| 5,896,063 | 4/1999 | Marsh et al. | 327/359 |
| 5,900,781 | 5/1999 | Igarashi et al. | 330/254 |
| 5,903,185 | 5/1999 | Cargill | 327/563 |
| 6,011,437 | 1/2000 | Sutardja et al. | 330/254 |

*Primary Examiner*—Timothy P. Callahan
*Assistant Examiner*—Terry L. Englund
*Attorney, Agent, or Firm*—Hickman Stephens Coleman & Hughes, LLP

[57] ABSTRACT

A VGA control circuit includes a differential control voltage generator having an input coupled to an external control voltage and having a pair of control voltage outputs, a transfer function compression region TFCR compensator coupled to the differential control voltage generator, and a TFCR detector coupled to the TFCR compensator and developing a compensator activation signal in response to the detection of a TFCR state in the transfer curve. A method for controlling a VGA circuit exhibiting transfer function logarithmic compression includes detecting when a VGA circuit is entering a logarithmic compression state, and applying an exponential compensation signal to the VGA circuit to cancel the compression state. A VGA system includes a VGA control system developing a plurality of differential control signals and a plurality of VGA stages coupled to the plurality of differential control signals. The control system includes a differential offset generator coupled to an internally generated control voltage, and a plurality of swing limiters developing the plurality of differential control signals. The voltage applied to the differential offset generator is generated by a PTAT and a $\tanh^{-1}$ generator which has its input tied to the external control voltage.

8 Claims, 13 Drawing Sheets

LINEAR QUAD VARIABLE GAIN AMPLIFIER AND METHOD FOR IMPLEMENTING SAME

CROSS REFERENCE TO RELATED APPLICATIONS

This application claims the benefit of co-pending U.S. provisional patent application Ser. No. 60/087,765, filed Jun. 2, 1998, which is incorporated herein by reference.

BACKGROUND OF THE INVENTION

This invention relates generally to electronic amplifiers, and more particularly to variable gain amplifiers (VGAs).

A certain group of variable gain amplifiers (VGA) convert a differential input voltage to a differential output voltage in response to the magnitude of a control voltage. VGAs are useful in a variety of analog electronic applications, many of which require a high degree of logarithmic transfer function linearity, i.e. where the control voltage varies linearly on a linear (x) axis, the amplitude varies linearly on a logarithmic (y) axis. This is known as a log-linear or linear-in-dB transfer function. As discussed below, prior art VGAs tend not to provide good linear-in-dB behavior (even to a "first order") over a wide dynamic range.

Figure 1:
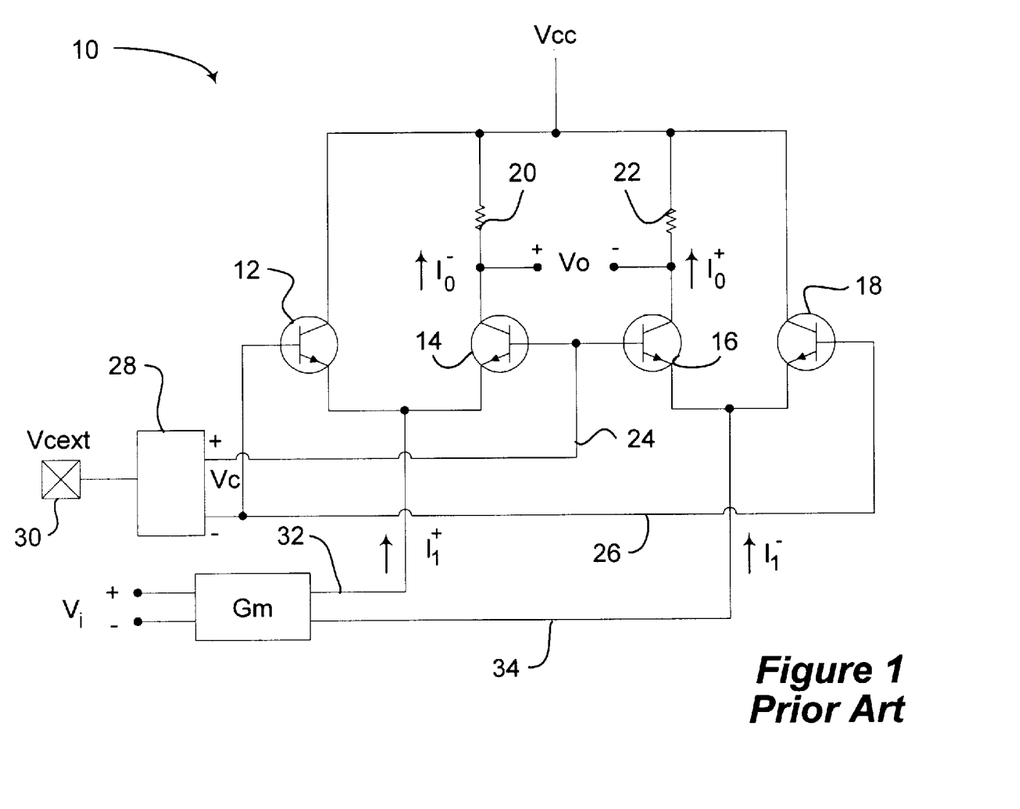
FIG. 1 is a schematic of a prior art VGA.

In FIG. 1, a VGA 10 of the prior art includes four bipolar NPN transistors 12, 14, 16 and 18. Because it has four transistors, VGAs such as VGA 10 are often referred to as "quad" VGAs. The collectors of transistors 12 and 18 are coupled directly to a power source (i.e. $V_{cc}$), and the collectors of transistors 14 and 16 are coupled to $V_{cc}$ by resistors 20 and 22, respectively. The output voltage $V_o$ is developed across the collectors of transistors 14 and 16.

The bases of transistors 12–14 are controlled by an internally developed differential control voltage $V_c$. That is, a line 24 connected to a $+V_c$ node is connected to the bases of transistors 14 and 16, while the $-V_c$ node is connected to the bases of transistors 12 and 18 by a line 26. The differential control voltage $V_c$ is developed by circuitry 28 connected to an external pin 30 of an integrated circuit device. An external control voltage $V_{CEXT}$ is applied to the pin 30 to control the gain of the VGA.

The circuitry 28 can range from the very simple to the relatively complex depending upon the amount and type of signal processing that is desired. In its simplest form, the circuitry 28 can include coupling line 24 to a fixed voltage, and a connection between the pin 30 and line 26. In a more complex design, the circuitry 28 includes circuitry for temperature compensation and/or circuitry for adjusting the slope of the transfer curve ("transfer function") of the VGA 10.

A differential input voltage $V_i$ is input to a voltage-to-current converter ($g_m$) to produce the currents $i_1^+$ on a line 32 and $i_1^-$ on a line 34. The line 32 is coupled to the emitters of transistors 12 and 14 while the line 34 is coupled to the emitters of transistors 16 and 18.

The operation of the VGA 10 of the prior art will be described with reference to the transfer function of FIG. 2. The equation for the transfer function is given below in Equation 1.

$$i_o/i_i = 1/(1 + e^{-V_C/V_T})  \quad\quad \text{Equation 1}$$

where $V_T = kT/q$.

In operation, a control signal $V_{CEXT}$ is applied to pin 30 to determine the degree of attenuation of the input signal. On the y axis of the graph of FIG. 2 is the current ratio $i_o/i_i$, which is measured in decibels (dB), and on the x axis of the graph is the control voltage $V_c$, as measured in volts. As can be seen, the transfer function 36 is essentially linear-in-dB in a region 38 where $V_c$ is negative. Above approximately $V_c=0$, i.e. in the positive region for $V_c$, a non-linear or "compressed" region 40 asymptotically approaches 0 dB.

For applications where a high degree of transfer function linearity is required, the prior art had little option but to operate the VGA 10 only within the linear region 38. However, this reduces the dynamic range of the VGA 10. It would therefore be desirable to have a VGA design which extends the dynamic range of the VGA so that it can operate linearly in regions where

SUMMARY OF THE INVENTION

In the present invention, a VGA system is provided which compensates for the compressed region of the transfer curve of the prior art to provide an extended linear-in-dB region of operation. This provides a wide dynamic range linear-in-dB gain control.

In one aspect of the present invention, a VGA control circuit includes a differential control voltage generator having an input coupled to an external control voltage and having a pair of control voltage outputs, a transfer function compression region (TFCR) compensator coupled to the differential control voltage generator, and a transfer function compression region "detector" coupled to the compensator and developing a compensator activation signal in response to detection of a compression region of the transfer curve. Typically, the compression region is logarithmic in nature and, therefore, the TFCR compensator provides an exponential compensation signal in compensation.

The differential control voltage generator preferably includes a first pair of transistors coupled to a first current source by a pair of degeneration resistors. The TFCR compensator preferably includes a second pair of transistors connected directly to a second current source. Due to the lack of degeneration resistors, the TFCR compensator develops an exponential control current to compensate for the logarithmic compression region in the transfer curve.

A method for controlling a VGA circuit exhibiting logarithmic compression in accordance with the present invention includes detecting when a VGA circuit is entering a logarithmic compression state, and applying exponential compensation to the VGA circuit to compensate for the logarithmic compression state. In one embodiment of the present invention, the operation of detecting when the VGA circuit is entering a logarithmic compression state includes detecting when a negative internally generated control voltage approaches zero volts.

A VGA system of the present invention includes a VGA control system developing a differential control signal, and at least one VGA "stage" or "cell" coupled to the differential L control signal. The VGA control system preferably includes a fixed to PTAT voltage converter coupled to an external control voltage, a differential offset generator and at least one differential swing limiter coupled to an output of the differential offset generator to develop a differential control signal.

In order to develop a desired degree of attenuation, the system may include a number of VGA stages connected in series. A differential swing limiter is provided for each of the VGA stages to provide individual control signals for those stages. Preferably, the VGA system also includes a PTAT generator and an inverse hyperbolic tangent circuit to couple the external control voltage to the differential offset generator.

An advantage of the present invention is that the VGA system exhibits good first order transfer function linearity (in dB) due to the compensation for the logarithmic compression region found in the transfer functions of VGAs of the prior art. Furthermore, by providing multiple VGA stages, an extended range of gain control with linear dB can be provided.

These and other advantages of the present invention will become apparent to those skilled in the art upon a reading of the following descriptions of the invention and a study of the several figures of the drawing.

DETAILED DESCRIPTION OF THE PREFERRED EMBODIMENTS

Figure 2:
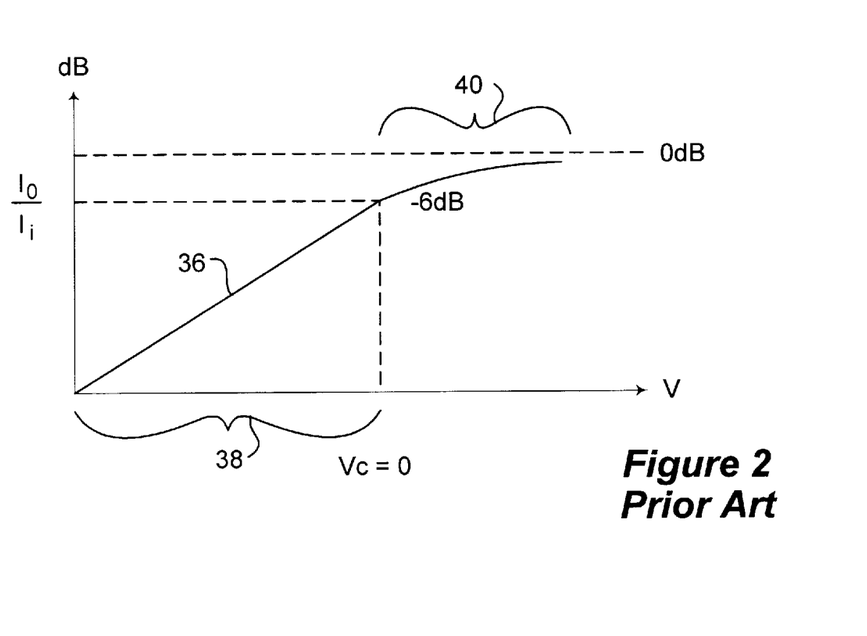
FIG. 2 is a graph of the transfer function for the VGA of FIG. 1.
Figure 3:
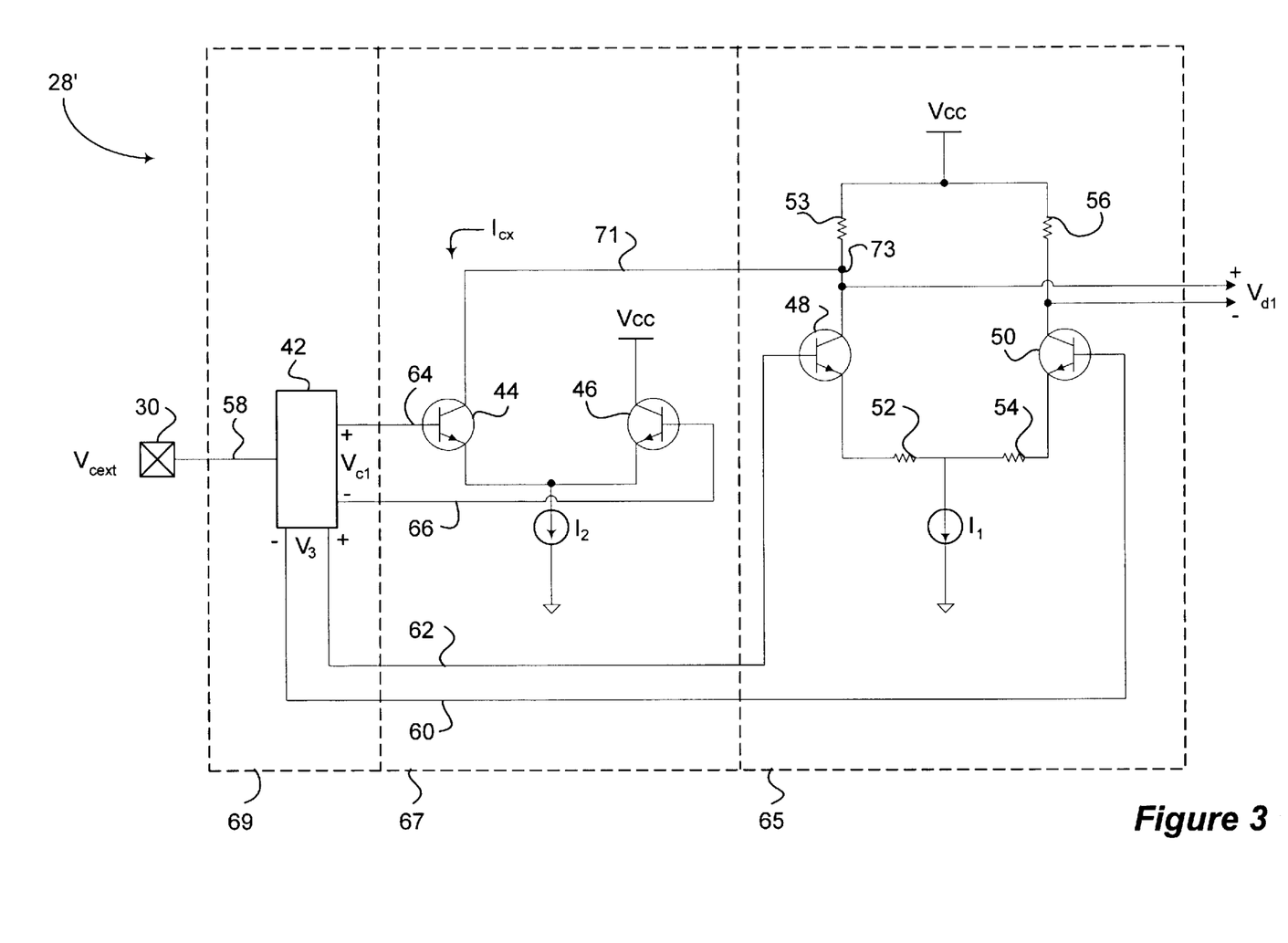
FIG. 3 is a schematic and block diagram of a VGA controller in accordance with the present invention.

FIGS. 1–2 were described with reference to the prior art. In FIG. 3, an improved circuit 28' for controlling a VGA is shown in schematic and block diagram form. The circuit 28' includes control voltage circuitry 42, four NPN bipolar transistors 44, 46, 48, and 50, a pair of current sources $I_1$ and $I_2$, a pair of degeneration resistors 52 and 53, and a pair of pull-up resistors 54 and 56.

The control voltage circuitry 42 is coupled to the external pin 30 by a line 58. It develops internal control voltages $V_3$ and $V_{c1}$. That is, a differential voltage $V_3$ is developed on lines 60 and 62, and a differential voltage $V_{c1}$ is developed on lines 64 and 66. Line 60 is coupled to the base of transistor 50, line 62 is coupled to the base of transistor 48, line 64 is coupled to the base of transistor 44 and line 66 is coupled to the base of transistor 46.

The emitters of transistors of 44 and 46 are coupled to the ground by current source $I_2$. The collector of transistor 44 is coupled to the collector of transistor 48, and the collector of transistor 46 is connected to the positive terminal of a power supply ($V_{cc}$). The emitters of transistors 48 and 50 are coupled to ground through degeneration resistors 52 and 54, respectively, and the current source $I_1$. The collectors of transistors 48 and 50 are coupled to $V_{cc}$ by pull-up resistors 53 and 56, respectively. The output $V_{d1}$ of the circuit 28' is taken from the collectors of transistors 48 and 50.

The portion 65 of circuit 28' serves as a differential control voltage generator. The portion 67 of circuit 28' serves as a transfer function compression region (TFCR) compensator, and the portion 69 of circuit 28' serves as a TFCR "detector." The differential control voltage generator 65 has inputs on the bases of transistors 48 and 50 that are coupled to the external control voltage $V_{CEXT}$ by the circuitry 42. The TFCR compensator 67 is coupled to the differential control voltage generator by a line 71. The TFCR detector 69 is coupled to the non-linear compensator 67 by the lines 64 and 66, and develops a compensator activation signal in response to the "detection" of a transfer function compression state. That is, circuitry 42 essentially compares $V_{CEXT}$ to an internally generated predetermined reference voltage, and then activates the TFCR compensator 67 by creating a positive $V_{C1}$ to turn on transistor 44. This, in turn, generates a current $I_{cx}$ which applies an exponential signal to the node 73. The signal is exponential due to the lack of degeneration resistors at the emitters of transistors 44 and 46, and is defined by Equation 2:

$$I_{CX} = e^{(V_3/V_T)} \qquad \text{Equation 2}$$

where $V_T$ is the thermal voltage and is fixed for a given temperature.

The control voltage $V_3$ is the normal VGA control voltage, which would otherwise create the compression region in the transfer curve described with reference to the prior art. However, the logarithmic transfer function compression region is compensated by the exponential current signal $i_{Cx}$ to provide an extended linear region in the transfer curve. The resultant $V_{c1}$ to the quad VGA circuitry will therefore compensate for the inherent TFCR of the quad VGA to provide good transfer function linearity (in dB) up to a hard limit.

Figure 4A:
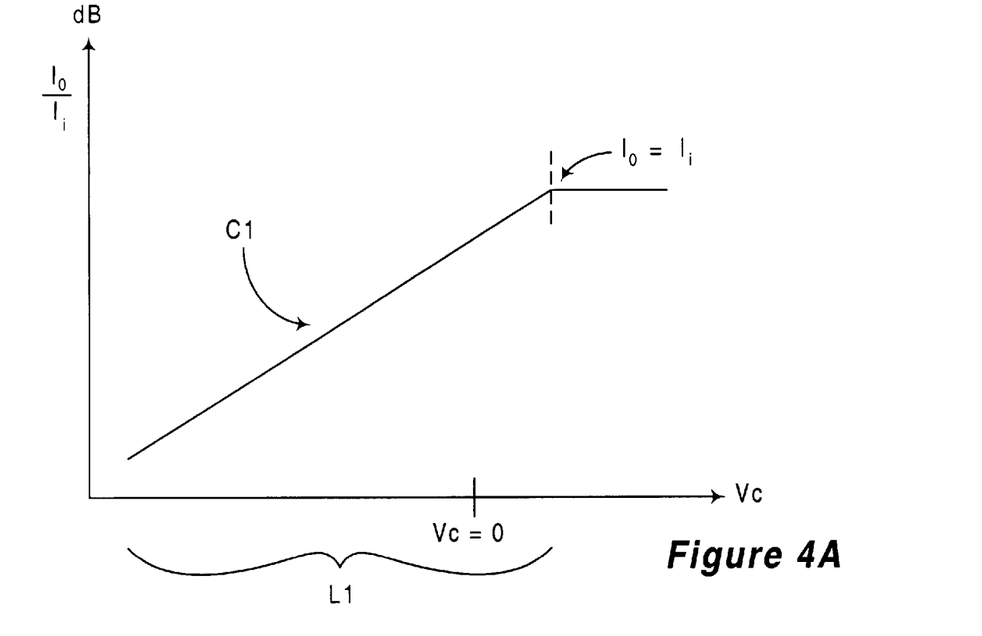
FIGS. 4A and 4B illustrate the operation of the VGA controller of FIG. 3.

FIGS. 4A and 4B illustrate several transfer functions that will be used to describe the operation of the circuit of FIG. 3. In FIG. 4A, a transfer curve C1 has a linear region L1 which extends well beyond $V_C=0$. However, the transfer curve C1 has a "hard limit" where $i_o=i_i$, which causes the curve C1 to flat-line, i.e. there is no further amplification. The current $i_o=i_o^+-i_o^-$, and the current $i_i=i_i^+-i_i^-$.

Figure 4B:
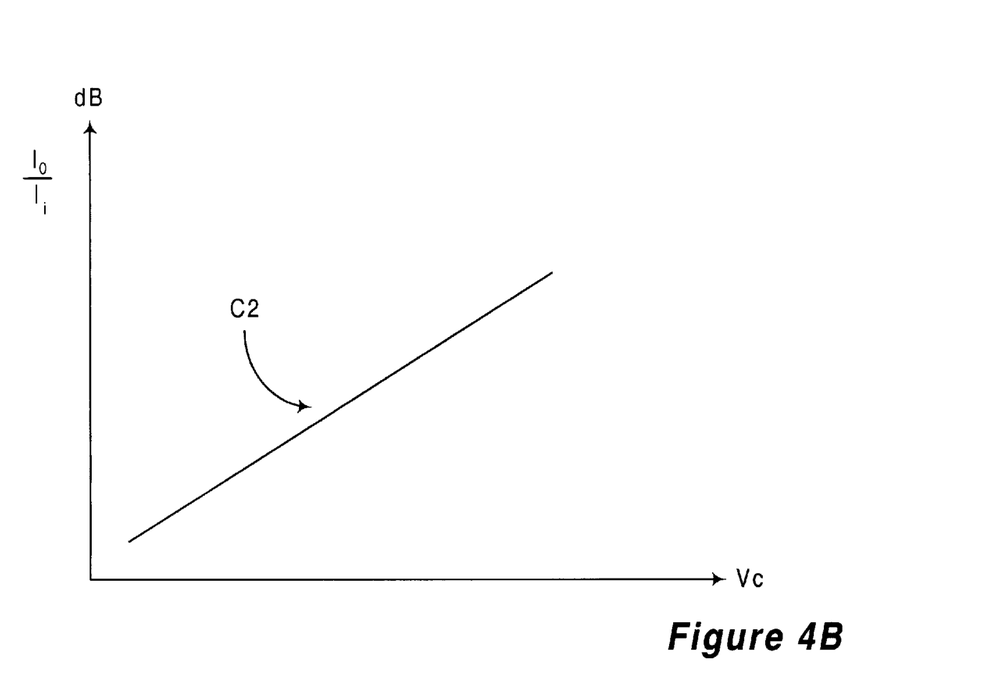

The transfer curve C2 of FIG. 4B illustrates an adjustment to the control voltage to shift the transfer curve to the right, moving the flat-line region from the operating voltage ranges of $V_{CEXT}$. The resultant transfer curve C2 is therefore first order linear in dB within its extended operating range.

Figure 5:
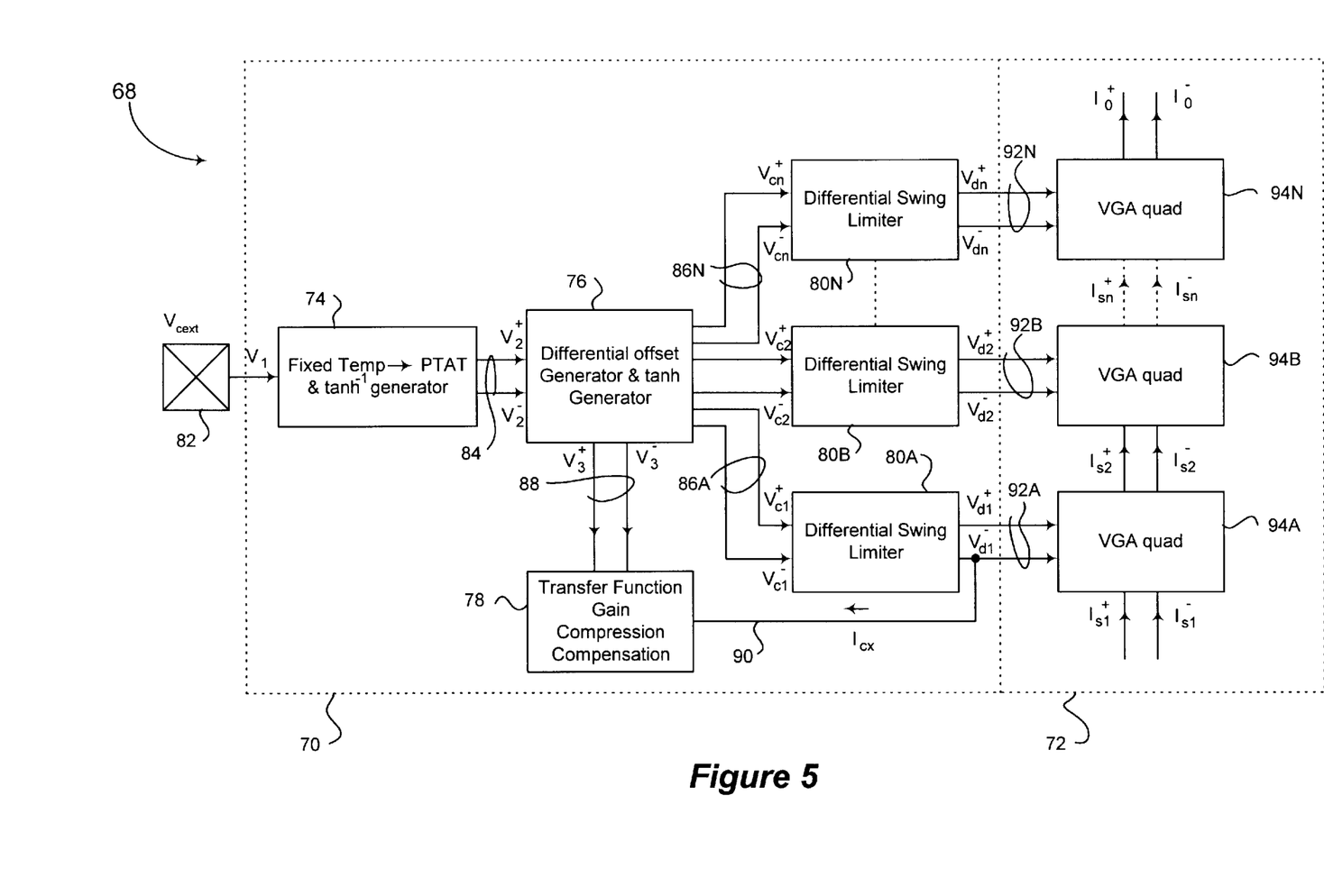
FIG. 5 is a block diagram of a VGA system of the present invention.

In FIG. 5 a VGA system 68 of the present invention includes a VGA controller portion 70 and a VGA array portion 72. The VGA controller portion 70 includes a first generator 74, a second generator 76, a compensator 78 and a number of differential swing limiters 80A, 80B, . . . 80N. The generator 74 serves two functions, a first of which is to convert the fixed temperature voltage $V_{CEXT}$ on external control pin 82 to a proportional-to-absolute-temperature (PTAT) signal. Secondly, the generator 74 has the function of generating an inverse hyperbolic tangent (tanh$^{-1}$) signal. This output signal is developed on lines 84 as $V_2^+$ and $V_2^-$. The generator 76 is a differential offset generator and hyperbolic tangent (tanh) generator. It develops a plurality of control signals for the signal limiters 80A–80N such as the differential control signals on lines 86A and 86N. As used herein, including in the specification and claims, "plurality" means two or more. The generator 76 also produces a differential output comprising $V_3^+$ and $V_3^-$ lines 88.

The transfer function gain compression compensator 78 is responsive to the differential signals $V_3^+$ and $V_3^-$ and develops a current $i_{CX}$ on a line 90 that is coupled to an output of the first differential swing limiter 80A. The differential swing limiters 80A–80N are responsive to the outputs of the differential offset generator and hyperbolic tangent generator 76 $V_{cx}^+$ and $V_{cx}^-$ (where x=1, 2, ..., N) and develop a plurality of control signals $V_{dx}^+$ and $V_{dx}^-$ (where x=1, 2, ... N) on lines 92A, 92B ... 92N.

The VGA array 72 includes a number of VGA cells 94A, 94B ... 94N which correspond to the differential swing limiters 80A, 80B ... 80N. These quad VGA cells are coupled in the series such that the output of one cell becomes the input of the next cell. More specifically, a differential input current $I_{s1}^+$ and $I_{s1}^-$ are input into quad VGA (also referred to as "VGA quad") 94A, which outputs a differential current $I_{s2}^+$ and $I_{s2}^-$ to VGA quad 94B and so forth until a current $I_{sn}^+$ and $I_{sn}^-$ is input to VGA quad 94N. The output of VGA quad 94N is the differential current $I_o^+$ and $I_o^-$.

Several things are to be noted with reference to the block diagram of FIG. 5. First, it is assumed that VGA 94A turns on at a maximum overall gain and, therefore, the output of the gain compression compensator 78 is applied to the VGA 94A. Second, certain components of the swing limiter 80N may or may not be used. That is, if VGA 94N is the last VGA to turn off when reducing the overall gain in the system components 48, 50, 52, 54, and $I_1$, of FIG. 3 may be eliminated.

Figure 6:
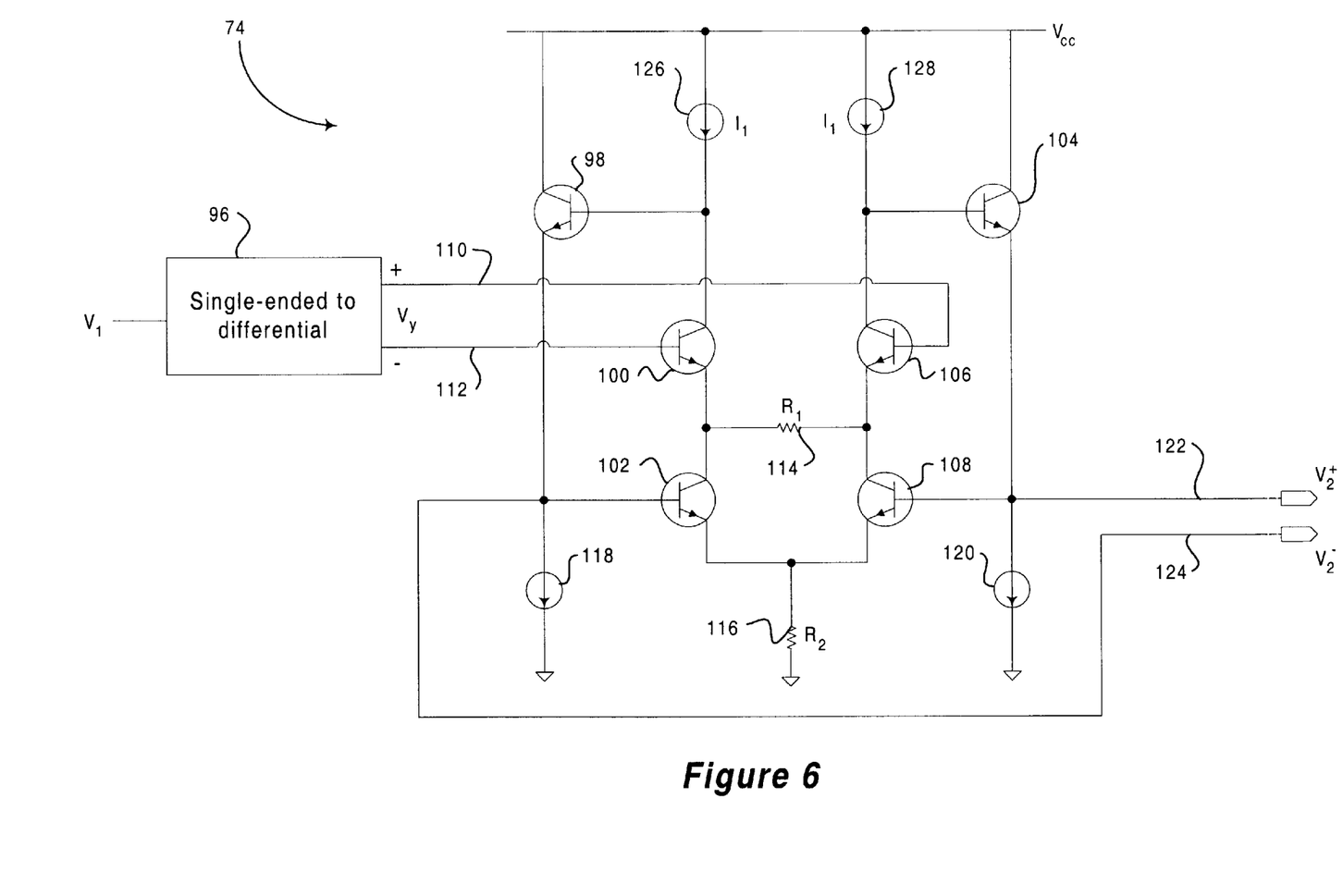
FIG. 6 is a schematic and block diagram of the generator 74 of FIG. 5.

In FIG. 6 a generator 74 of FIG. 5 in accordance with the present invention is illustrated in schematic and block diagram form. The generator 74 includes a single-ended to differential circuit 96 and six transistors 98, 100, 102, 104, 106 and 108. The single-ended to differential circuit 96 takes the single ended signal $V_1$ and creates differential signals $V_1^+$ and $V_y^-$ on lines 110 and 112.

Line 112 is coupled to the base of transistor 100, and the line 110 is coupled to the base of transistor 106. The emitter of transistor 100 is coupled to a resistor 114 and to the collector of transistor 102. Likewise, the emitter of transistor 106 is coupled to the collector of transistor 102. The emitters of transistor 102 and 108 are coupled to ground by a resistor 116. The bases of transistors 102 and 108 are also coupled to ground by current sources 118 and 120, respectively. The differential output voltages $V_2^+$ and $V_2^-$ are developed on lines 122 and 124, respectively, which are coupled to the bases of transistors 108 and 102, respectively. The emitters of transistors 98 and 104 are coupled to the bases of transistors 102 and 108, respectively. The base of transistor 98 and the collector of transistor 100 are coupled to $V_{cc}$ by current source 126, and the base of transistor 104 and the collector 106 are coupled to $V_{cc}$ by current source 128. The collectors of both transistors 98 and 104 are coupled to $V_{cc}$.

It should be noted that the circuit 74 is operated in a large signal region. Similar circuits to circuit 74 have been used previously in small signal regions, with much different output results. That is, when operated in a small signal region (where $V_1$ is small), the output voltage $V_2$ is given by equation 3:

$$V_2 = V_2^+ - V_2^- = K_1 V_1 V_T \qquad \text{Equation 3}$$

where $V_T$=the thermal voltage=KT/q, and where $K_1$ is a fixed number proportional to $1/R_1 I_{R2}$. $V_2$ is therefore PTAT.

However, in the large signal mode (where $V_y$ is large) where the circuit 74 of the present invention is operated, the output of the circuit is governed by equation 4:

$$V_2 = V_T \tanh^{-1}(K_1 V_1) \qquad \text{Equation 4}$$

and is therefore an inverse hyperbolic tangent (tanh$^{-1}$) function and is also PTAT. This inverse hyperbolic tangent function is subsequently fed to a hyperbolic tangent (tanh) stage for linearization, i.e. the tanh function tends to provide a cancellation of the tanh$^{-1}$ function. As an example of operating ranges, $V_1$ can vary from 0.5 V to 2.5 V in both a monotonic and linear fashion in this large signal mode resulting in a PTAT $V_2$ that swings about ±90 mV at room temperature.

Figure 7:
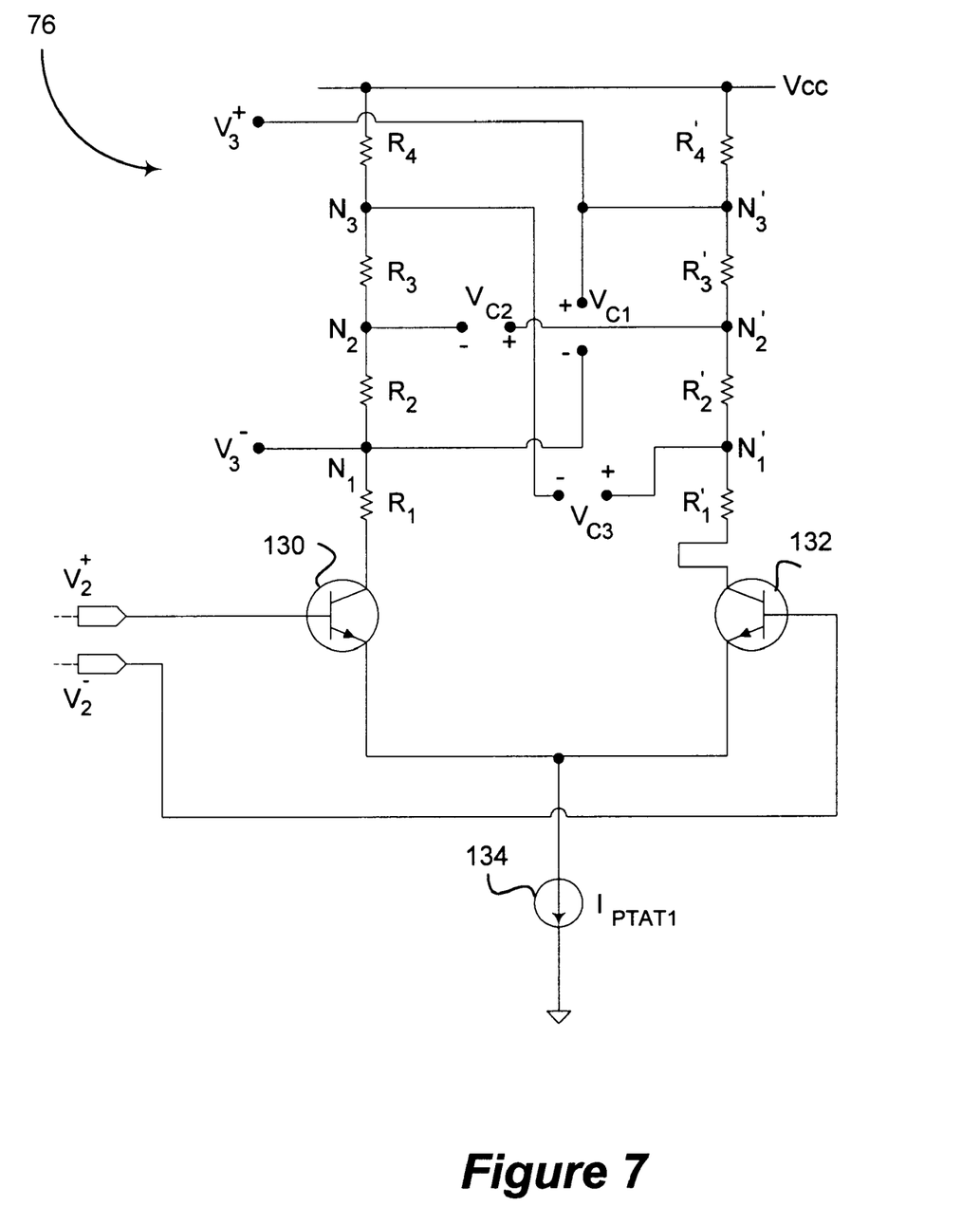
FIG. 7 is a schematic of one embodiment of a generator 76 of FIG. 5.

In FIG. 7, the differential offset and tanh generator 76 of FIG. 5 is illustrated in schematic form. It should be noted that the embodiment of FIG. 7 is only one specific example of a tanh generator for a N-stage VGA (i.e. where N=3). Other generator designs can be used for alternative embodiments of the present invention, as will be appreciated by those skilled in the art.

The exemplary generator 76 of FIG. 7 includes a pair of transistors 130 and 132, series of resistors $R_1$, $R_2$, $R_3$, $R_4$, coupling the collector of transistor 130 to $V_{CC}$, a series of resistors $R_1'$, $R_2'$, $R_3'$, and $R_4'$ coupling the collector of transistor 132 to $V_{CC}$, and a current source 134 coupling the emitters of transistors 130 and 132 to ground. The base of transistor 130 is coupled to $V_2^+$, and the base of transistor 132 is coupled to $V_2^-$. the output $V_{c1}$ is taken between nodes N1 and N3', the output $V_{c2}$ is taken between nodes N2 and N2', and the output $V_{c3}$ is taken between nodes N3 and N1' of the voltage dividers made by the series connections of the resistors.

This generator 76 cancels the tanh$^{-1}$ effect of generator 74 such that the output voltages are linear and proportional to both $V_1$ and $V_T$. The output voltages $V_c$ are governed by Equation 5:

$$V_c = V_{ci}^+ - V_{ci}^- = K_2 \tanh(\tanh^{-1}(K_1 V_1 V_T)) = K_2 K_1 V_1 V_T \qquad \text{Equation 5}$$

In addition, this generator 76 produces the proper differential offsets to be used by compensator 78 and limiters 80.

In order to preserve a uniform slope for the overall transfer function of the VGA, the slopes of the voltages coming out of generator 76 should be the same. This is achieved by observing the following relationship:

(index on transistor 130 side)+(index on transistor 132 side)=a constant for all $V_{ci} = V_{ci}^+ - V_{ci}^-$, i=1 to N. For example, the index of $V_{c3}$=3+1=4; the index of $V_{c2}$ is 2+2=4; and the index of $V_{c1}$=1+3=4; where the index number corresponds to the node numbers in the figure.

Figure 8A:
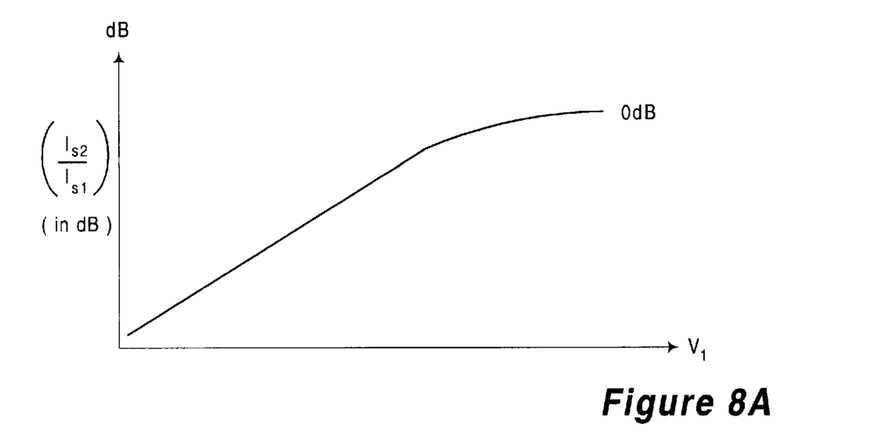
FIGS. 8A–8C illustrate the desirability of the differential swing limiters 80A–80N of FIG. 5.
Figure 8B:
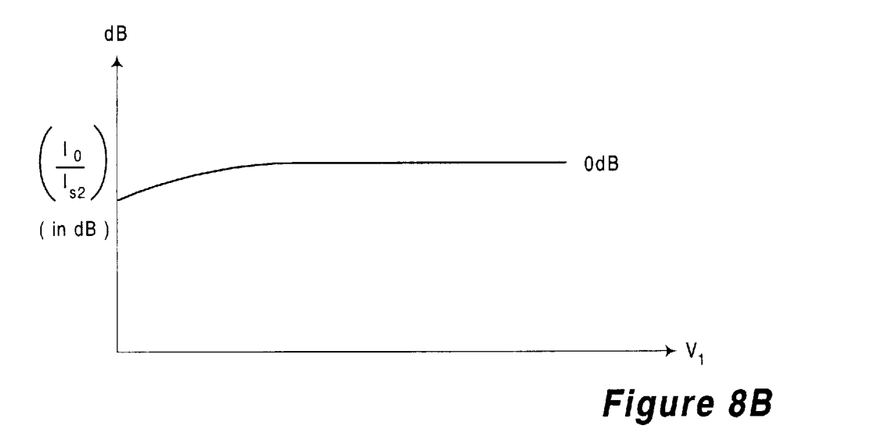
Figure 8C:
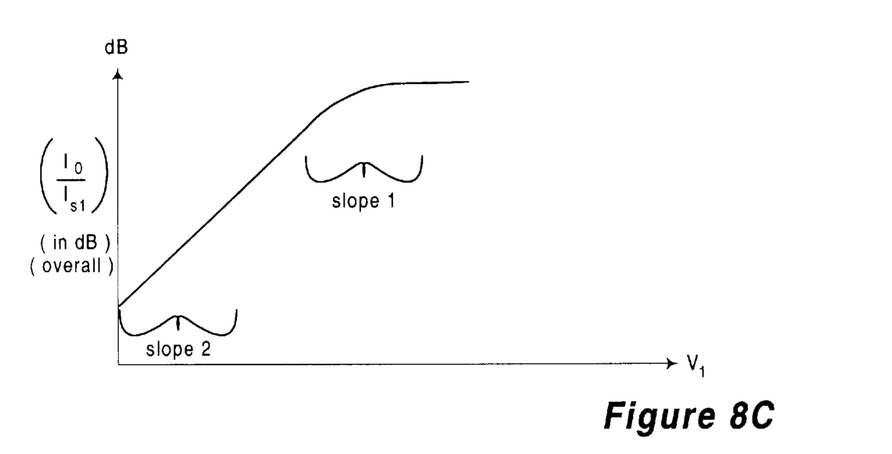

FIGS. 8A–8C illustrate the need for the swing limiters 80. If the output of the generator 76 were to be applied directly to the VGA stages 94, the resulting overall transfer function of the VGA system would have multiple varying slopes ($i_o/i_i$ in dB). In the example of a two stage VGA array 72, a first stage VGA quad may produce a transfer function as illustrated in FIG. 8A, while a second stage VGA quad may produce a transfer function as illustrated in FIG. 8B. The overall transfer finction would then be as illustrated in FIG. 8C, have two sloped regions labeled "Slope 1" and "Slope 2." It is therefore desirable to provide the swing limiters 80, as described below.

Figure 9:
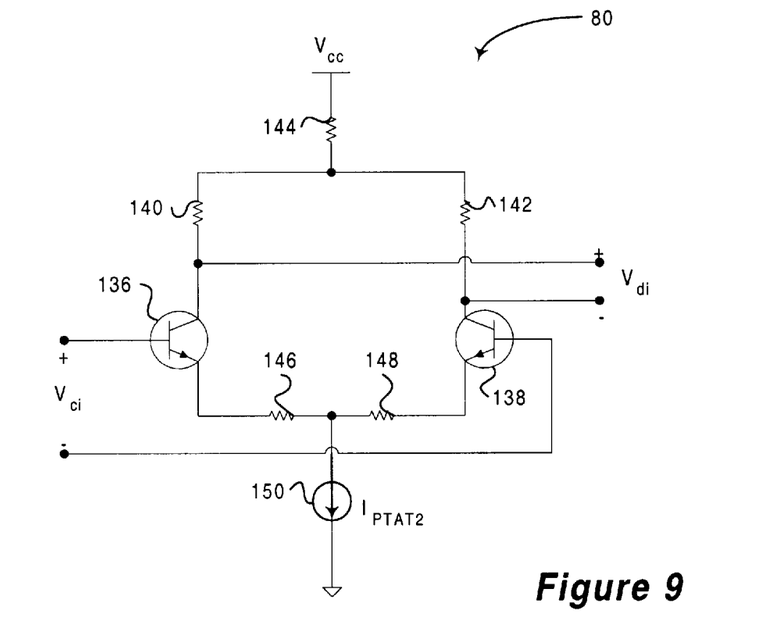
FIG. 9 is a schematic of a differential swing limiter 80 of FIG. 5.

In FIG. 9, a swing limiter 80 of the present invention includes a pair of NPN transistors 136 and 138, resistors 140–148, and a current source 150. The collector of transistor 136 is coupled to $V_{CC}$ by resistors 140 and 144, and the collector of transistor 138 is coupled to $V_{CC}$ by resistors 142 and 144. The emitter of transistor 136 is coupled to ground by resistor 146 and current source 150, and the emitter of transistor 138 is coupled to ground by resistor 148 and current source 150. The input $V_{ci}^+$ is applied to the base of transistor 136, and the input $V_{ci}^-$ is applied to the base of transistor 138. The output $V_{di}^+$ is taken from the collector of transistor 136, and the output $V_{di}^-$ is taken from the collector of transistor 138. For both $V_{ci}$ and $V_{di}$, i=1, 2, . . . N.

The swing limiters 80 limit the swing of the voltage applied to the VGA quads 94 so that the overall uniform slope is preserved. The swing limiters are heavily degenerated differential amplifiers, which may be followed by buffers, as will be appreciated by those skilled in the art. The resistor 144 is used to set the proper common mode, as will also be appreciated by those skilled in the art.

Figure 10:
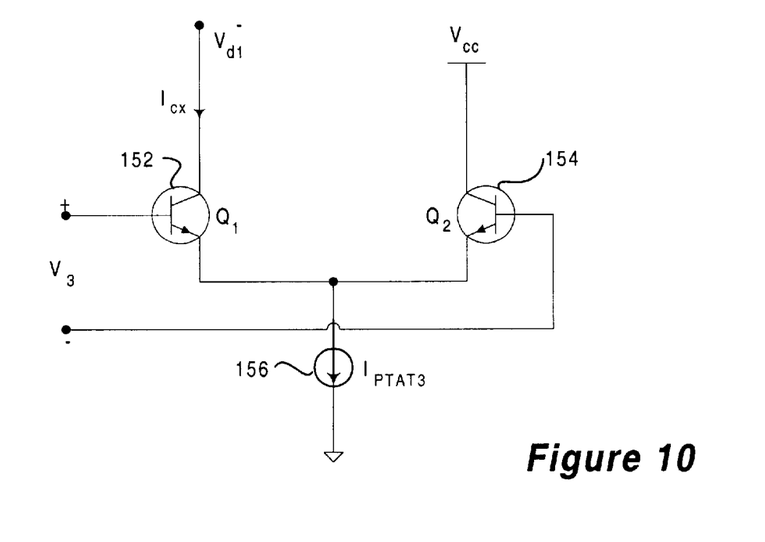
FIG. 10 is a schematic of the circuit 78 of FIG. 5.

FIG. 10 illustrates the compensator 78 in schematic form. The compensator 78 includes a pair of transistors 152 (Q1) and 154 (Q2), and a current source 156 coupling the emitters of transistors 152 and 154 to ground. The collector of transistor 152 is coupled to $V_{di}^-$, and the collector of transistor 154 is coupled to $V_{CC}$. The base of transistor 152 is coupled to $V_3^+$, and the base of transistor 154 is coupled to $V_3^-$.

The compensator 78 is a simple differential amplifier which turns on at the proper point to compensate for the flattening of the transfer function at maximum gain. In many cases, $V_3^+$ is the same as $V_{Ci}^+$ and $V_3^-$ is the same as $V_{Ci}^-$.

Figure 11A:
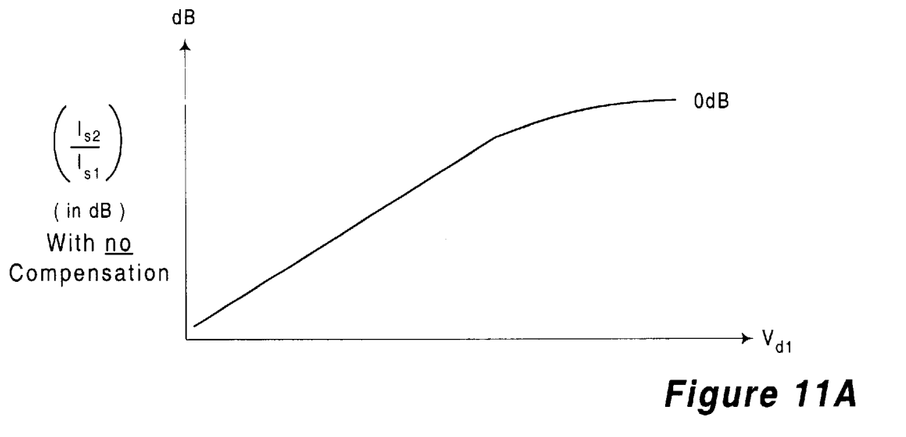
FIGS. 11A and 11B illustrate the operation of the overall system of FIG. 5 before offset adjustment.
Figure 11B:
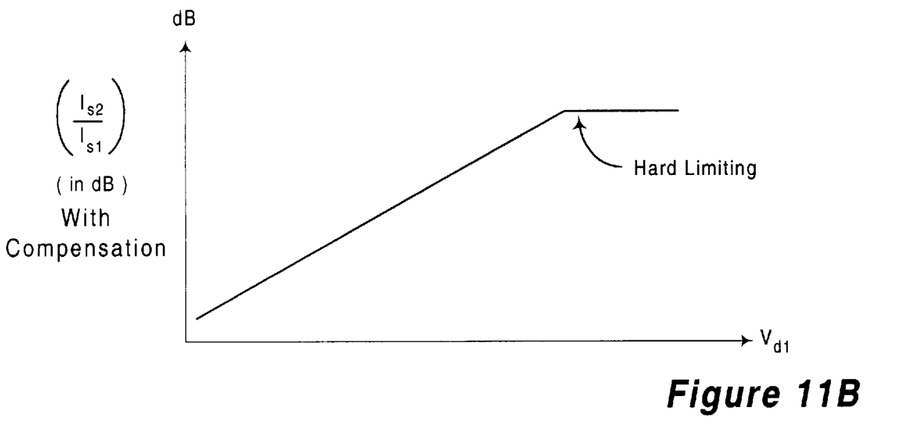
Figure 12:
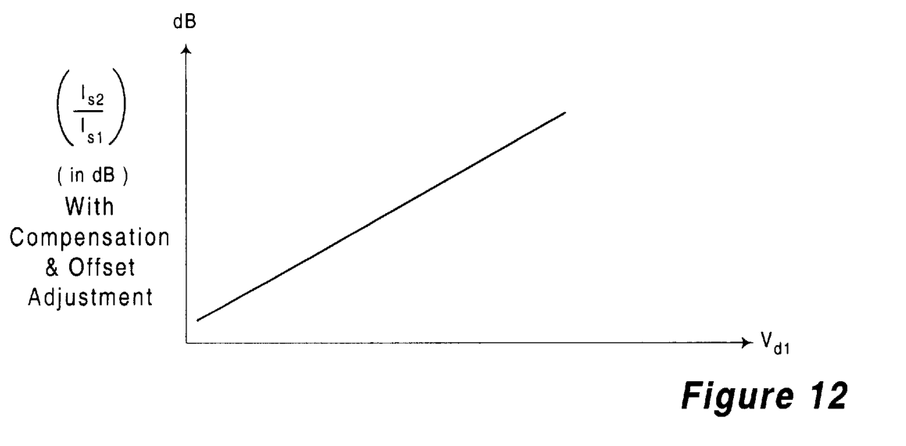
FIG. 12 illustrates the output transfer function of the overall system of FIG. 5 after offset adjustment.

With additional reference to FIGS. 11A and 11B, by properly selecting $V_3$, transistor 152 will start pulling current $i_{cx}$ exponentially (i.e. $i_{cx}$ proportional to $e^{(V_3/V_T)}$) resulting in first order correction for the soft limiting of the quad VGA stages. The soft limiting (without compensation) is illustrated in FIG. 11A, and the hard limiting created by the compensation of the present invention is illustrated in FIG. 11B. The hard limiting illustrated in FIG. 11B is then eliminated by shifting the transfer curve to the right, as illustrated in FIG. 12. This is accomplished by adjusting the differential offset in the generator 76, as will be appreciated by those skilled in the art. The resulting transfer curve of FIG. 12 is therefore linear in dB over a wide dynamic range, as desired.

Figure 13:
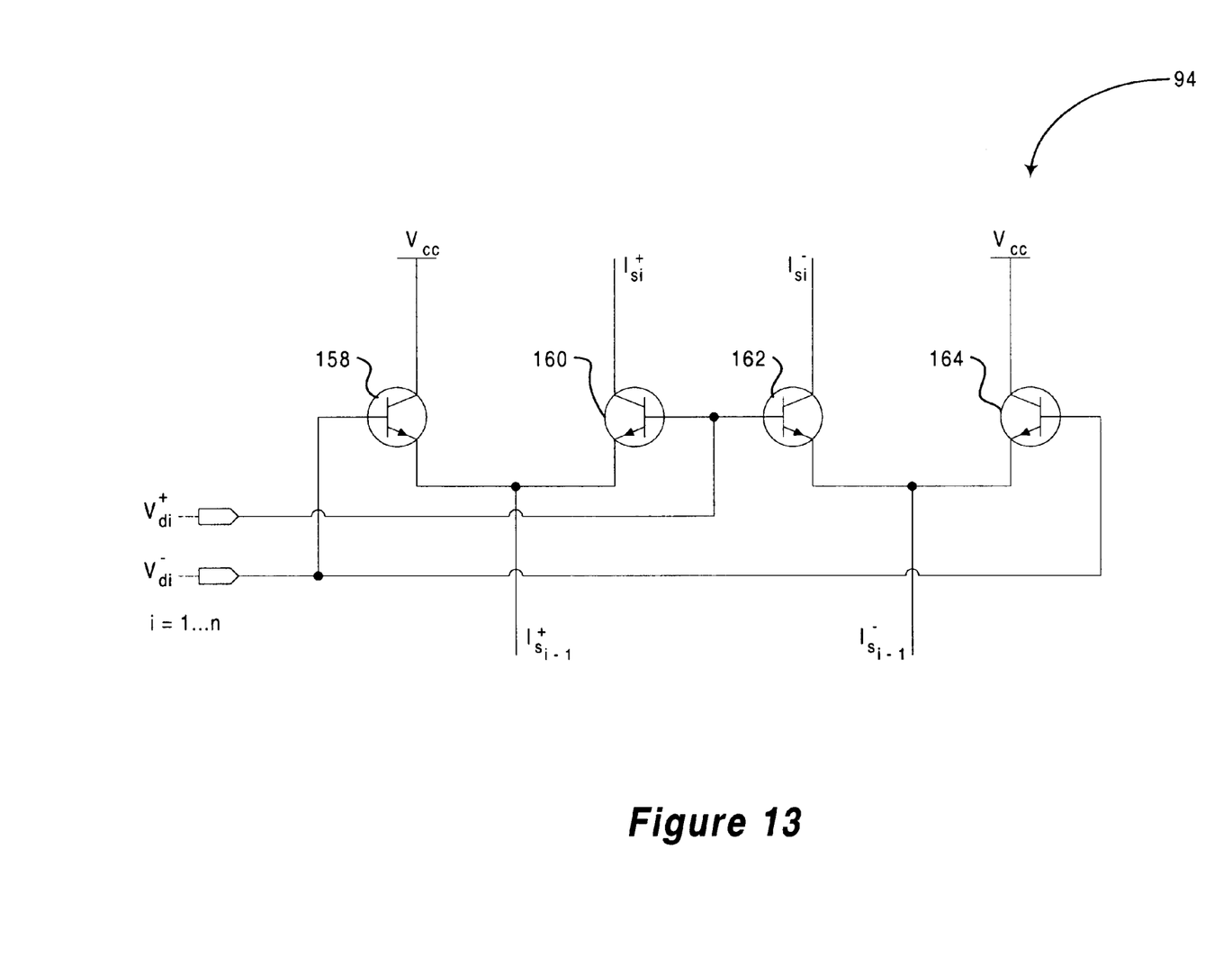
FIG. 13 is a schematic of a quad VGA cell 94 of FIG. 5.

A quad VGA (or "VGA quad") 94 is illustrated in FIG. 13. The VGA quad 94 includes four NPN transistors 158, 160, 162, and 164. The emitters of transistors 158 and 160 are coupled to $I_{si-1}^+$, and the emitters of transistors 162 and 164 are coupled to $I_{si-1}^-$. The collectors of transistors 158, 160, 162, and 164 are coupled to $V_{CC}$, $I_s^+$, $I_s^-$, and $V_{CC}$, respectively. The bases of transistors 160 and 162 are coupled to $V_{di}^+$, and the bases of transistors 158 and 164 are coupled to $V_{di}^-$.

In the illustration of FIG. 13, each stage or cell 94 shows a current in and a current out. As will be appreciated by those skilled in the art, the input can be a voltage by using an appropriate Gm stage. The output of the stages 94 can also be a voltage by providing load resistors on the outputs.

Figures 14A, 14B:
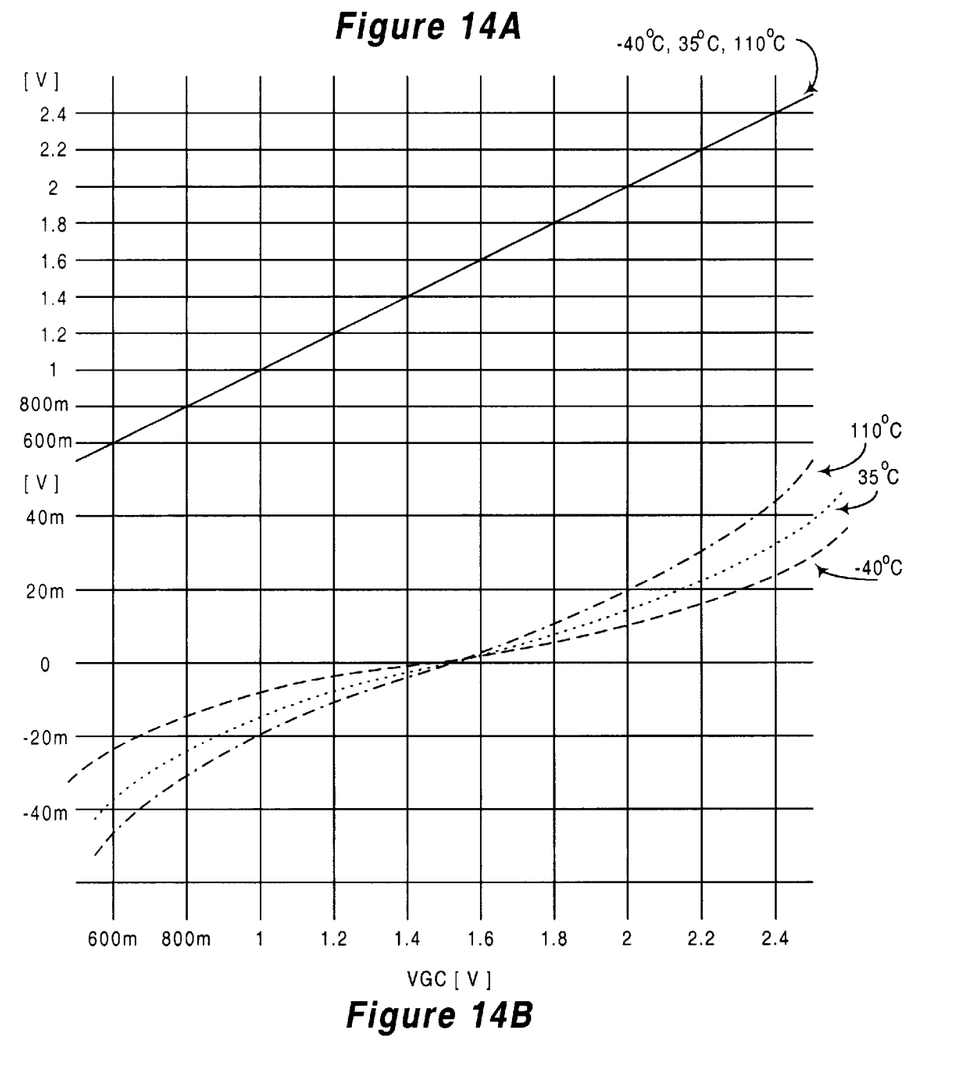
FIG. 14A illustrates the fixed-with-temperature characteristic of the externally applied control voltage.
FIG. 14B demonstrates the PTAT behavior of output of block 74 of FIG. 5 as well as its inverse tanh characteristic.

The graph or plot of FIG. 14 is divided into a section (a) and a section (b). Section (a) illustrates the external gain control, fixed with temperature. In this example, a gain control range of 0.5 to 2.5 volts is assumed. Section (b) illustrates that the voltage of section (a) has a PTAT characteristic as well as a $\tanh^{-1}$ shape. The waveform is centered at (0.5+2.5)/2=1.5 volts.

Figure 15A:
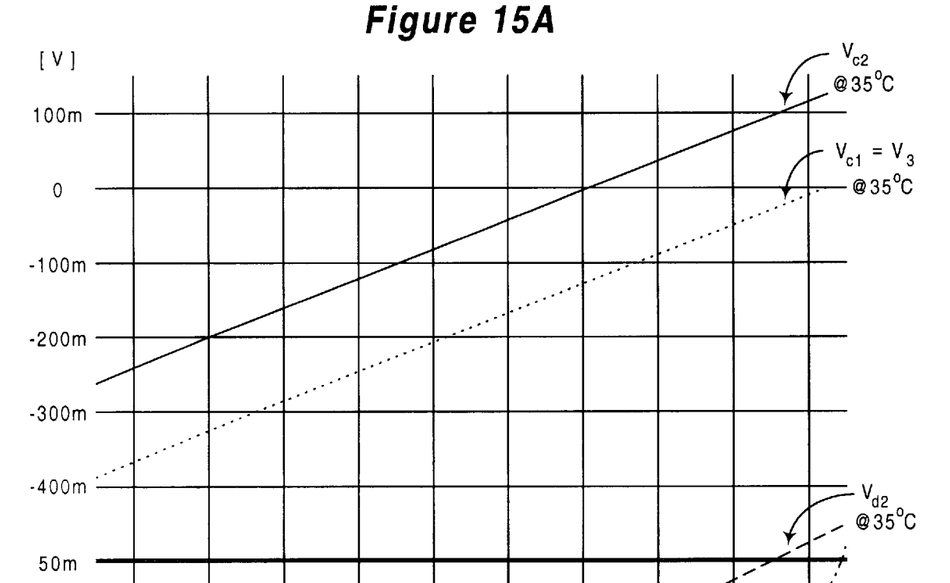
FIG. 15A demonstrates the outputs of the differential offset generators 80 of FIG. 5.

The graph or plot of FIG. 15 is likewise divided into a section (a) and a section (b). With reference to section (a), and in this example, the outputs of the differential offset generators are shown (two stages are assumed). It should be noted that the $\tanh^{-1}$ characteristic of $V_2$ has been canceled and that a linear curve has been achieved. It should also be noted that differential offsets are generated (zero crossing points of $VC_1$ vs. $VC_2$. Finally, it should be noted that, in this example, only voltages at 35° C. have been shown, and that in this case $V_3 = VC_1$ has been chosen.

Figure 15B:
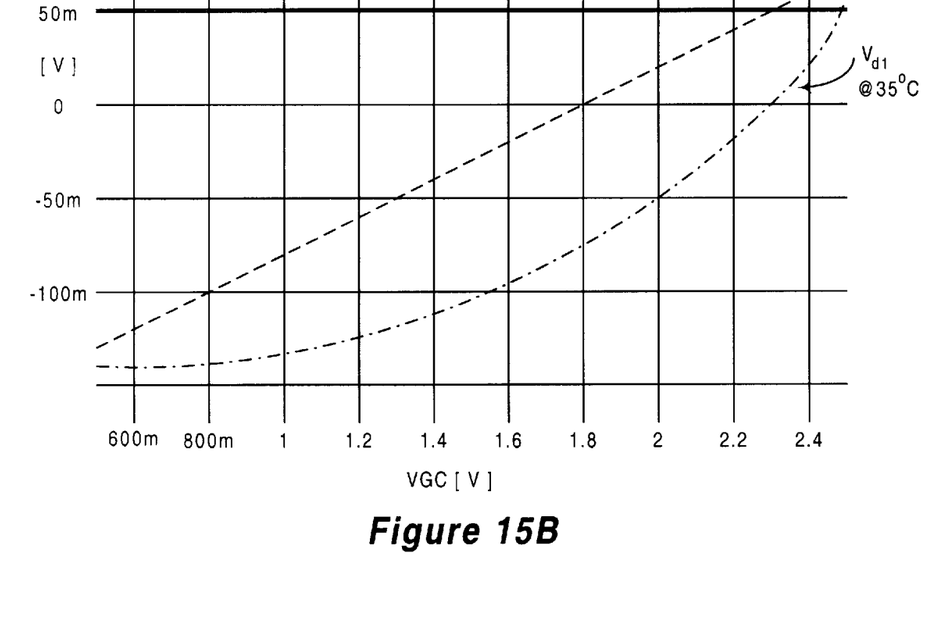
FIG. 15B demonstrates the actual control voltage applied to the VGA quad 94 by 80 of FIG. 5.

In section (b) of FIG. 15, the signal $V_{d1}$ exhibits swing limitation at small VGC and exponential characteristics at large VGC. $V_{d2}$ is linear and its amplitude is adjusted to a proper level for the desired gain range, as will be appreciated by those skilled in the art.

Figure 16:
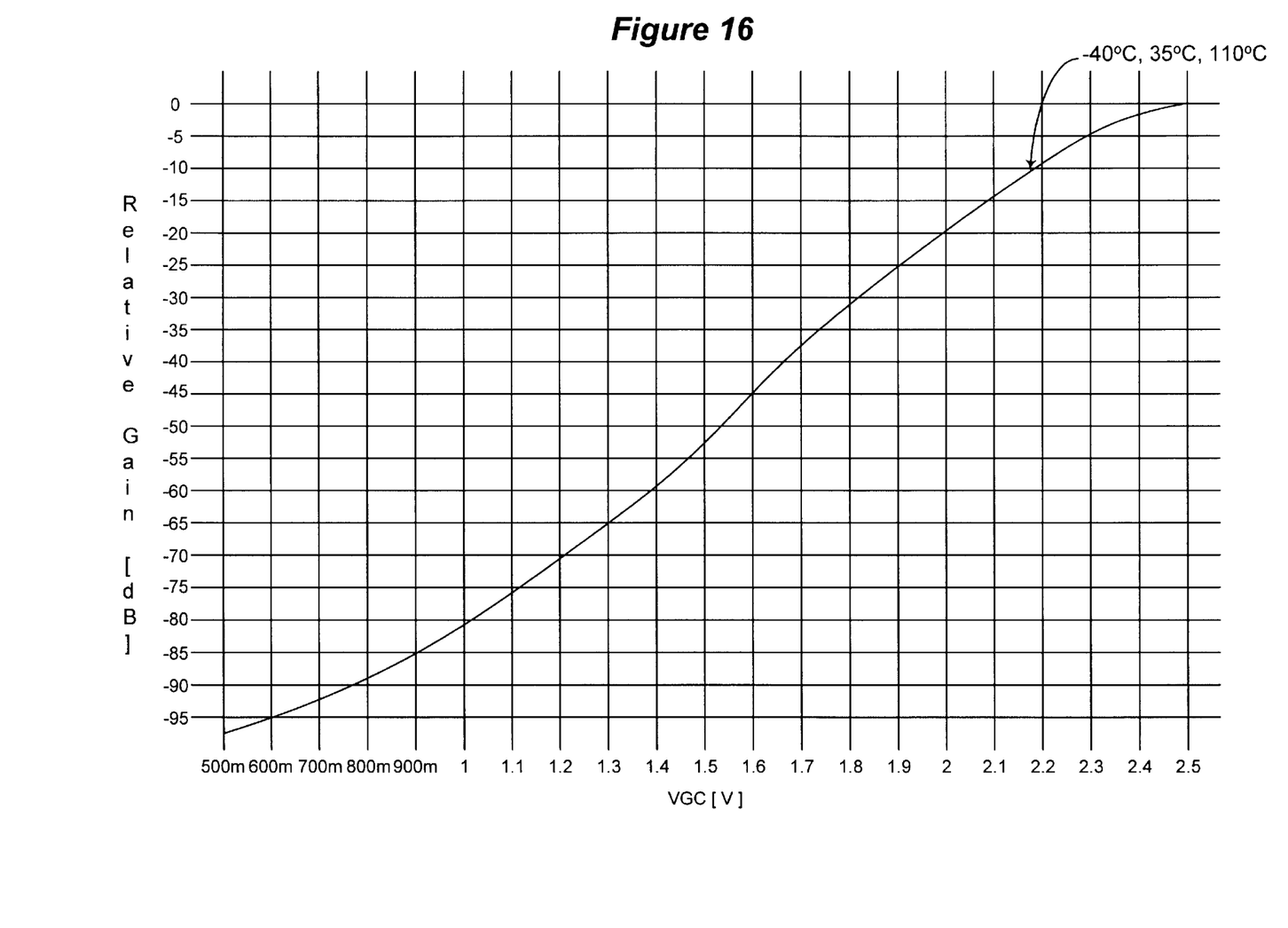
FIG. 16 illustrates and exemplary overall relative gain of a VGA of the present invention for 3 different temperatures.

The graph or plot of FIG. 16 shows the overall relative gain of the VGA system (i.e. $i_o/i_{s1}$ in dB). It should be noted that this transfer function exhibits minimal maximum gain compression and has excellent stability with temperature. Therefore, a VGA system has been provided with a wide dynamic range, excellent temperature stability, and good transfer function linearity in dB.

While this invention has been described in terms of several preferred embodiments, it is contemplated that those skilled in the art will realize various alternatives, modifications, permutations and equivalents thereof. It is therefore intended that the following appended claims include all such alternatives, modifications, permutations and equivalents as fall within the true spirit and scope of the present invention.

What is claimed is:

1. A VGA system comprising:
    a VGA control system including:
        a differential offset generator coupled to internally generated control voltages; and
        a plurality of differential swing limiters coupled to an output of said differential offset generator and developing a plurality of differential control signals; and
    a plurality of VGA stages, coupled in series, for receiving corresponding ones of said plurality of said differential control signals, whereby said plurality of VGA stages is controlled by said VGA control system.

2. A VGA system as recited in claim 1 further comprising:
    a transfer function gain compression compensator; and
    said output of said differential offset generator includes a plurality of outputs; wherein said transfer function gain compression compensator is coupled to at least one of said plurality of outputs of said differential offset generator and said transfer function gain compression compensator provides a compensation signal to a first of said plurality of differential control signals.

3. A VGA system as recited in claim 2 further comprising a PTAT generator and wherein said PTAT generator generates said internally generated control voltages utilizing an external control voltage.

4. A VGA system as recited in claim 3 wherein said PTAT generator includes an inverse hyperbolic tangent circuit means operating in a large signal mode.

5. A VGA system as recited in claim 4 wherein an output of said inverse hyperbolic tangent circuit means is at least partially cancelled by a hyperbolic tangent generator means.

6. A VGA system as recited in claim 1 wherein said plurality of VGA stages exhibits a logarithmic compression state, and wherein said VGA control system develops an exponential compensation signal to compensate for said logarithmic compression state.

7. A VGA system as recited in claim 4 wherein a transfer function of said VGA system exhibits first order linearity in dB of transfer function.

8. A VGA system as recited in claim 7 wherein said transfer function of said VGA system exhibits substantial temperature stability.

* * * * *

UNITED STATES PATENT AND TRADEMARK OFFICE
CERTIFICATE OF CORRECTION

PATENT NO. : 6,091,275
DATED : July 18, 2000
INVENTOR(S) : Arya R. Behzad

It is certified that error appears in the above-identified patent and that said Letters Patent is hereby corrected as shown below:

Column 2,
Line 14, reads "linearly in regions where"; it should read -- linearly in regions where $V_c>0$ --;
Line 54, reads "L control signal. The VGA control system preferably"; it should read -- control signal. The VGA control system preferably --

Column 3,
Lines 58-59, read "$I_2$, a pair of degeneration resistors 52 and 53, and a pair of pull-up resistors 54 and 56."; they should read -- $I_2$, a pair of degeneration resistors 52 and 54, and a pair of pull-up resistors 53 and 56. --;

Signed and Sealed this

Twenty-first Day of May, 2002

Attest:

Attesting Officer

JAMES E. ROGAN
*Director of the United States Patent and Trademark Office*